United States Patent [19]

Boer et al.

[11] 4,139,817

[45] Feb. 13, 1979

[54] IMPEDANCE-SWITCHING CONNECTOR

[75] Inventors: Machiel Boer; James E. Dikeman, both of Beaverton, Oreg.

[73] Assignee: Tektronix, Inc., Beaverton, Oreg.

[21] Appl. No.: 723,004

[22] Filed: Sep. 13, 1976

[51] Int. Cl.² .............................................. G01R 1/06
[52] U.S. Cl. ................................ 324/72.5; 200/11 G; 333/22 R; 333/81 A; 338/229
[58] Field of Search ................. 333/22 R, 81 A, 97 S; 324/72.5, 149; 338/215, 216, 220, 49, 76, 221, 229; 339/108 TP; 200/11 G, 11 J, 11 K, 153 S, 159 R

[56] References Cited

U.S. PATENT DOCUMENTS

| 2,790,051 | 4/1957 | Sicho | 324/72.5 X |
|---|---|---|---|
| 2,927,269 | 3/1960 | Ecker et al. | 324/72.5 X |
| 2,958,054 | 10/1960 | Concelman | 333/97 S X |
| 3,196,217 | 7/1965 | Petrina | 324/72.5 X |
| 3,525,056 | 8/1970 | Qurashi | 333/22 R |

FOREIGN PATENT DOCUMENTS 47-25907 7/1972 Japan ...................................... 333/81 A Primary Examiner—Paul L. Gensler
Attorney, Agent, or Firm—John D. Winkelman

[57] ABSTRACT

An electrical signal transmission line connector having a switch-selectable termination resistor within the connector body. Use of the connector at the output of a signal acquisition probe allows it to be used with electrical instruments, such as oscilloscopes, having different input impedances.

9 Claims, 6 Drawing Figures

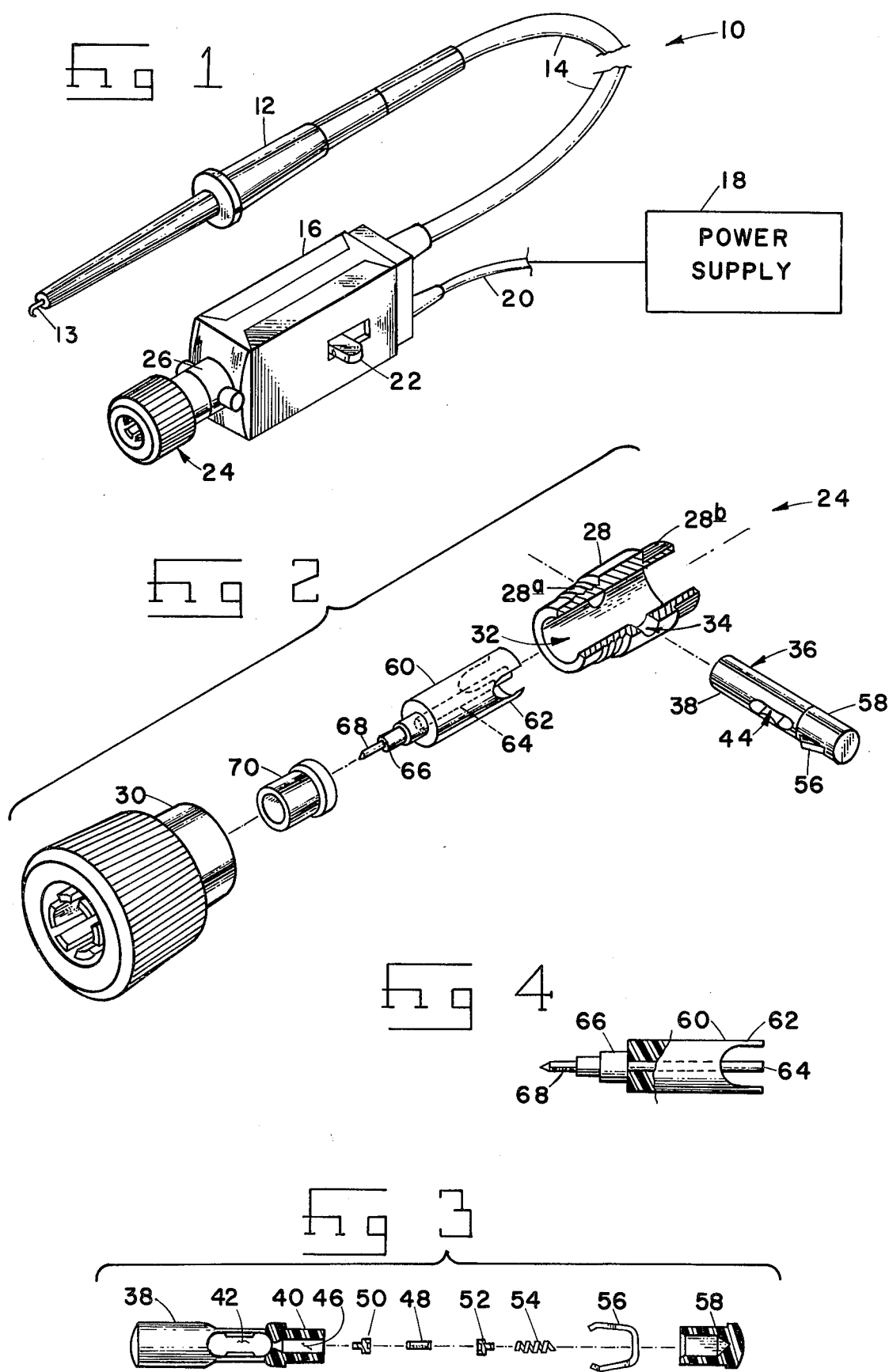

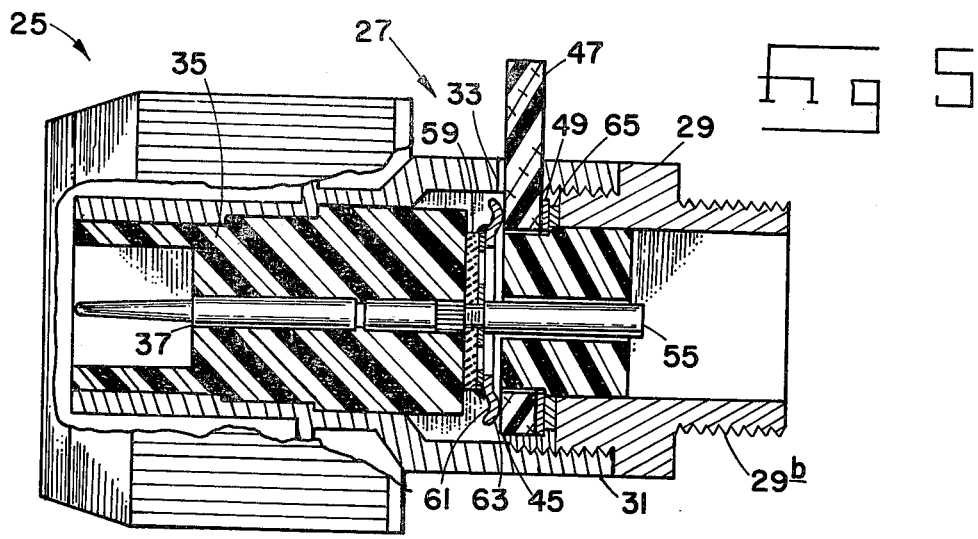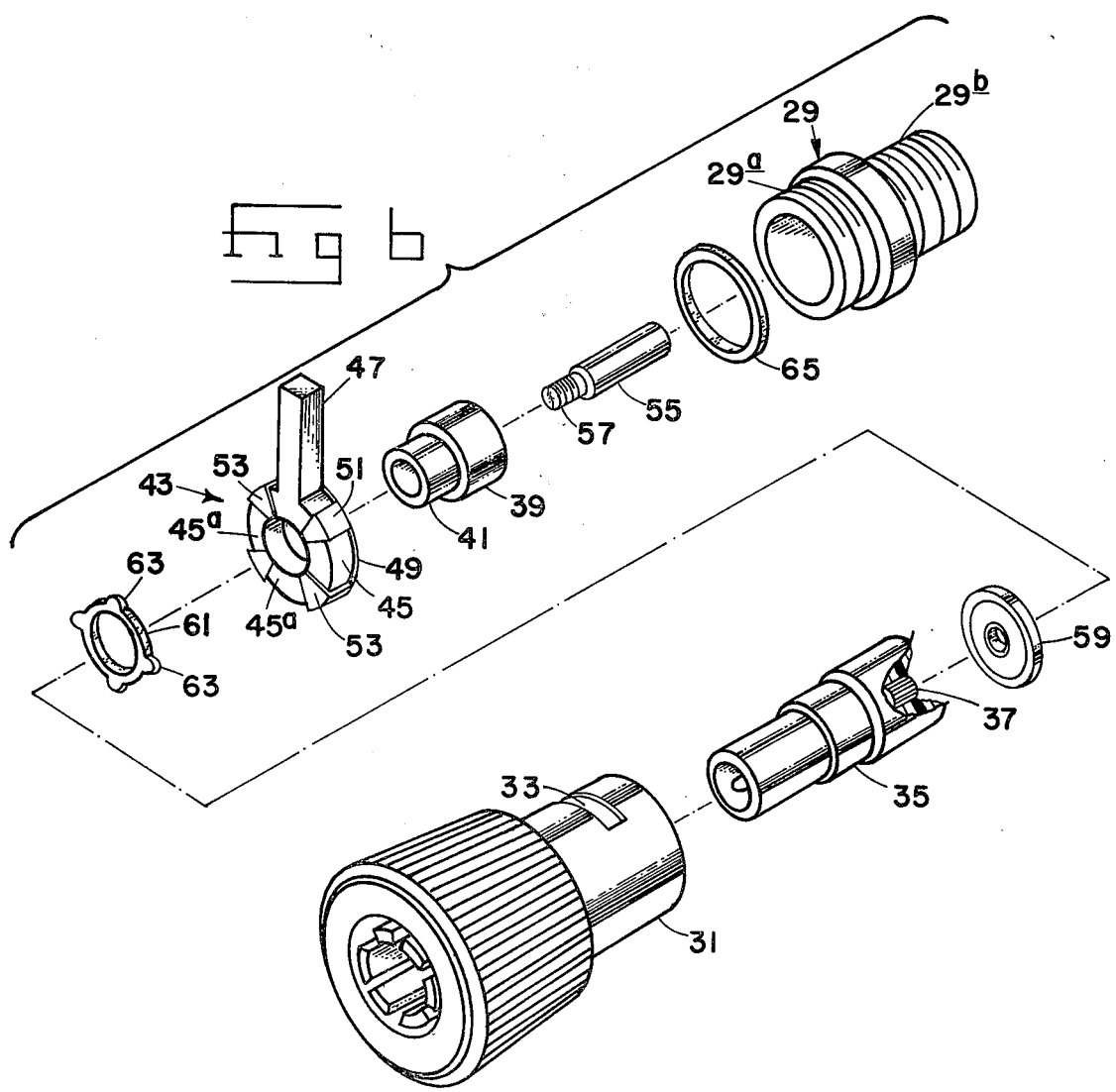

IMPEDANCE-SWITCHING CONNECTOR

BACKGROUND OF THE INVENTION

The present invention relates generally to an electrical connector for a signal transmission line, and more particularly to a combined connector and switchable termination for such a line.

The switchable termination/connector device of the present invention is particularly suited for use with certain signal acquisition probes for oscilloscopes and other measuring, monitoring, and signal processing instruments. For that reason, the following description is directed primarily to embodiments of the invention intended for such use.

For reasons which are well understood to those of ordinary skill in the art, active probes (those containing an active device such as a field effect transistor (FET) or vacuum tube) and passive probes of the Zo variety typically are designed to drive, or "look into", a low impedance load, such as the 50 ohm input impedance of a sampling or extremely wide bandwidth real time oscilloscope. When such a probe is used with an oscilloscope having a high impedance input (e.g., 1 megohm paralleled by 15-20 pF), it is necessary to terminate the probe output (or scope input) with a low value, usually 50 ohm, resistor. In the past, this has been done by coupling the probe output and oscilloscope input connectors with a 50 ohm feedthrough termination, or, in the case of certain active probes, by providing a switch-selectable 50 ohm termination resistor in a control box adjacent the probe output connector.

Such prior art practices have a number of disadvantages. For example, the use of separate feedthrough terminations is inconvenient, since they may become mislaid or lost when not in use, and the possibility of mechanical damage to the connectors is increased by the added length and weight of the termination. In addition, if not carefully designed, the feedthrough termination may cause an impedance mismatch or imbalance in the signal transmission line. Inclusion of a termination resistor and switch in an active probe's control box necessitates a larger enclosure than would be required otherwise, placing a greater stress on the oscilloscope input connector and making access to the instrument's front panel controls more difficult. Further, connecting the resistor and switch to the signal path within the enclosure tends to cause impedance mismatching and signal distortion. Thus, a need exists for a device which combines signal line connection and selected termination functions in a compact, integral unit, and which is free from the drawbacks mentioned above.

Accordingly, a general object of the present invention is to provide a device which meets the above-identified need in a practical and satisfactory manner.

A more specific object of the invention is to provide a signal transmission line connector having means for selectively terminating the line with a desired impedance value.

Another object of the invention is to provide a termination impedance-switching output connector for an electrical signal acquisition probe, enabling the probe to be used with electrical instruments having different input impedances.

Still another object of the invention is to provide an impedance-switching probe connector including a pair of conductors forming a transmission line for an electrical signal, and means for selectively shunting the line with a termination resistor of a desired value to adapt the probe for use with electrical instruments having an input impedance different from that of the probe.

A further object of the invention is to provide an input connector for a low output impedance probe having a switch-selectable termination resistor within the connector to adapt the probe for use with either low or high input impedance instruments at the user's option.

These and other objects, features and advantages of the present invention will be apparent to those skilled in the art as the following detailed description of certain preferred embodiments is read in conjunction with the accompanying drawings.

BRIEF DESCRIPTION OF THE DRAWINGS

FIG. 1 is a perspective view of an oscilloscope probe having an impedance-switching output connector in accordance with the present invention;

FIG. 2 is an exploded perspective view of the impedance-switching connector shown in FIG. 1;

FIG. 3 is an exploded side view, partly in section, of a switch actuator for the connector shown in FIG. 2;

FIG. 4 is a side view, partly in section, of a contact pin/insulator subassembly for the FIG. 2 connector;

FIG. 5 is a side view, partly broken away and partly in section, of an alternative embodiment of the invention; and FIG. 6 is an exploded perspective view of the alternative embodiment.

DESCRIPTION OF PREFERRED EMBODIMENTS

Turning now to the drawings, wherein like reference numerals indicate like elements throughout, an FET probe for an oscilloscope is indicated generally at 10 in FIG. 1. Probe 10 includes a body 12 having a hook tip 13 for connection to a circuit under test. The probe body is connected by a coaxial cable 14 to a housing 16 containing a signal amplifier and associated circuitry (not shown). Operating power for the probe is supplied by a conventional power supply, indicated in block form at 18, connected by a power cable 20 to an on-off switch 22 in housing 16. An impedance-switching output connector 24 is secured to one end of housing 16, the left end in the figure. Connector 24 is adapted to mate with a BNC-type input connector of an oscilloscope or other electrical measuring, monitoring or signal processing instrument.

Typical of modern FET probes, probe 10 has a high input impedance (high resistance, low capacitance) to minimize loading of a circuit under test. The output of the probe amplifier is designed to drive directly a 50 ohm load, such as the 50 ohm input impedance of a sampling oscilloscope. To adapt the probe for use with conventional oscilloscopes having a high input impedance, as well as instruments having a 50 ohm input, output connector 24 is provided with an integral, two position "push button" termination switch 26. In one position, used when the probe is connected to an instrument having a 50 ohm input impedance, the amplifier output is fed directly through output connector 24 to the instrument's input. In the other switch position, selected when the probe is used with a high input impedance instrument, a 50 ohm termination resistor is connected between the inner and outer conductors of connector 24, and thus across the output of the probe amplifier.

Referring now to FIG. 2 along with FIG. 1, output connector 24 includes a tubular metal body 28 having an externally threaded portion 28a and a knurled portion 28b. Connector 24 is secured to housing 16 by pressing the knurled portion into a suitably sized opening (not shown) at the forward end of the housing. Portion 28a is threaded into the rear end of a standard female BNC-type coaxial connector shell 30.

Body 28 has a major, axial bore 32, and a minor, transverse bore 34 extending through the midportion of the body, intersecting bore 32. Disposed in bore 34, and sized to move freely back and forth therein, is an elongate push button actuator 36. Referring to FIG. 3, actuator 36 comprises a generally cylindrical, molded plastic member 38 having a reduced diameter end portion 40 and an elongate transverse central opening 42. For a reason which will become evident, opening 42 is of a modified hourglass shape, i.e., it has a narrowed central portion 44 (FIG. 2). Extending through end portion 40 into one end of opening 42 is an elongate axial passage 46 having the configuration shown. A termination resistor 48, suitably having a value of 50 ohms, is contained in passage 46 between opposing metal ferrules 50, 52. The outer end of ferrule 50, the left end in the figure, extends through the necked-down portion of the passage into opening 42. The outer end of ferrule 52 is captured in one end of a compression spring 54. The opposite end of the spring contacts a generally U-shaped metal wireclip 56. A plastic cap 58, bonded on end portion 40 of member 38, retains the clip, spring, ferrules and resistor in position in passage 46.

Again referring to FIG. 2, together with FIG. 4, a tubular insulator 60 having a cut-away rear end section 62 is received in bore 32 of body 28. A metal rod 64 extends the length of insulator 60 through the center thereof, and is joined at its forward end to a stepped boss 66 carrying a projecting pin 68. An insulating sleeve 70, suitably a standard male BNC-connector sleeve, disposed in shell 30 receives boss 66, positioning pin 68 within the forward end of the sleeve in the assembled connector. As should be evident, shell 30, sleeve 70 and pin 68 comprise the mating portion of a conventional male coaxial connector, herein a BNC-type connector.

The portion of rod 64 within end section 62 of insulator 60 extends toward the rear of body 28 through opening 42 in the push button actuator, and is connected in a suitable manner to circuitry within housing 16. While opening 42 is sized to accomodate rod 64 comfortably in both of the opening's opposite end portions, the diameter of the rod slightly exceeds that of the opening's narrowed central portion 44. Such being the case; moderate pressure is required to move actuator 36 back and forth in bore 34 and, in effect, move rod 64 from one end of opening 42 to the other. The resilience of the plastic and the configuration of opening 42 combine to provide a degree of "snap action" as actuator 36 is moved back and forth. Thus, the actuator can occupy either of two "stable" positions relative to body 28 — one in which cap 58 is disposed at least partly within the body, and the other in which the cap is completely outside body 28. In the first-mentioned position, rod 64 extends through the end of opening 42 adjacent cap 58, i.e., the right end in FIGS. 2 and 3. In that position, the outer end of ferrule 50 contacts the side of rod 64, and clip 56 contacts the walls of bore 34, forming a conductive path from rod 64 to body 28 through ferrule 50, resistor 48, ferrule 52, spring 54, and clip 56. When actuator 36 is moved to its other position, the conductive path is broken.

In the just-described termination impedance-switching connector embodiment, body 28 and shell 30 together form the outer (or signal reference level) conductor of a coaxial transmission line in which rod 64, boss 66 and pin 68 collectively comprise the inner (or signal-carrying) conductor. Thus, when actuator 36 is in the first-described stable position, resistor 48 shunts the transmission line, terminating it adjacent the output end of connector 24 with a desired resistance value, herein 50 ohms, and adapting the probe for use with an oscilloscope having a high input impedance. When the actuator is in its other stable position, the transmission line is unterminated, thereby adapting the probe for connection to an instrument having a low impedance input.

FIGS. 5 and 6 illustrate an alternative embodiment of the invention similar electrically, but differing mechanically from that shown in FIGS. 1-4. The principal differences lie in the use of an annular disc resistor disposed in coaxial alignment with the transmission line, and in the provision of a two position rotary switching mechanism instead of the pushbutton-type switching arrangement described above.

Referring to FIGS. 5 and 6, impedance-switching connector 25, which includes an integral switch 27, includes a tubular metal body 29 having a forward portion 29a threaded into the rear end of a connector shell 31. Another threaded portion 29b adapts the connector for attachment to an enclosure, such as housing 16 (FIG. 1) or to some other object, such as a coaxial cable. Connector shell 31 is a standard male BNC-type shell modified to include a slot 33, best shown in FIG. 6, which extends about 45° around the circumference of the shell. Received within the portion of shell 31 forward of slot 33 is a shaped dielectric member, or insulator, 35 carrying an elongate metal pin 37. Both insulator 35 and pin 37 suitably are standard BNC-type connector components.

A stepped insulating sleeve 39 having a reduced diameter forward section 41 is disposed in body 29 with section 41 extending outward from the body, as shown in FIG. 5. Mounted for rotation on the projecting sleeve section is a switch rotor 43 comprising an annular body 45 of an insulating material having an integral operating handle 47. Handle 47 extends radially outward from body 45 and through slot 33 in shell 31. Rotor body 45 and handle 47 suitably are fabricated from fiberglass reinforced plastic. Adhered or otherwise secured to the rear face of body 45 is a thin metallic annular disc 49. As shown in FIG. 6, disc 49 is connected by individual metal straps 51 to four electrical contact pads 53 secured to the front face of the rotor body.

Extending axially through the center of sleeve 39 is an elongate rod 55 having a threaded forward end 57 carrying an annular disc resistor 59. Rod end 57 is threaded into a mating bore (not shown) provided in the rear end of pin 37, thereby clamping resistor 59 to the rear face of insulator 35, as shown in FIG. 5. The center bore and rim of the resistor are provided with metal cladding, best shown in FIG. 6. Secured, as by soldering, to the metal clad rim of resistor 59 is a contact ring 61 forming a stator in switch 27. Ring 61, suitably fabricated of a conductive spring metal, such as phosphor bronze or beryllium copper, includes four integral contacts 63 which bear against the forward face of switch rotor 43 as shown in FIG. 5. A metallic spring washer 65 is interposed between rotor 43 and the forward end of tubular body 29 to bias the rotor toward the stator contacts.

Referring briefly to FIG. 6, it will be apparent that the forward face of rotor 43 includes four electrically conductive areas, contact pads 53, separated by four nonconductive areas 45a on the front face of body 45. In one position of switch 27, the position shown in both FIGS. 5 and 6, each of the stator contacts 63 bears against a corresponding nonconductive area 45a on the front face of rotor 43. Thus, although the center of termination resistor 59 is always electrically connected to pin 37 and rod 55, which together form the center conductor of a coaxial signal transmission line, no conductive path exists between the resistor and body 29 or shell 31, which form the outer conductor for the line. Moving handle 47 the length of slot 33 places switch 27 in its other position and shunts resistor 59 across the line. Movement of the handle rotates pads 53 into contact with their respective stator contacts, forming multiple conductive paths from the rim of termination resistor 59 to body 29 through contacts 63, pads 53, straps 51, metal disc 49 and washer 65.

In the just-described embodiment, the coaxial nature of the switching arrangement, together with the use of a coaxial termination resistor, serve to minimize impedance irregularities within the connector. In both embodiments, inclusion of the termination resistor and selector switch within the body of the connector provides improved electrical characteristics, compared with prior art termination switching arrangements, as well as the numerous mechanical advantages described above.

The impedance-switching connector of the present invention also has utility as a termination for a coaxial cable or other signal transmission line. In such an application, as will be understood, the termination resistor preferably has the same value as the nominal impedance of the line.

There is thus provided an impedance-switching connector construction which amply fulfills the various objectives set forth above. While two preferred embodiments of the invention have been described, it will be appreciated that various other modifications and changes may be made without departing from the spirit of the invention. For example, impedance-switching connectors may be constructed for use with other types of transmission line connectors. Other variations will be apparent to those skilled in the art.

We claim:

1. An impedance-switching connector for an electrical signal transmission system, said connector including
a generally tubular portion comprising a first conductor,
a second conductor disposed within said portion,
said first and second conductors comprising a transmission line for such a signal,
a resistor, and
switch means including means mounting said resistor for movement into and out of electrical contact with said conductors for selectively shunting said line with said resistor.

2. The connector of claim 1, wherein said resistor has substantially the same value as the nominal impedance of said transmission line.

3. A termination impedance-switching output connector for an electrical probe, said connector including
a generally tubular member comprising first conductor means for communicating an electrical reference level,
second conductor means disposed within said member for communicating an electrical signal,
said first and second means comprising a transmission line for such a signal,
a termination impedance element, and
switch means including means mounting said element for movement into and out of electrical contact with said conductors for selectively shunting said line with said element.

4. The connector of claim 3, wherein said impedance element consists of a resistor.

5. A signal acquisition probe for an electrical instrument, said probe including an impedance-switching output connector having means therein for terminating the input of said instrument with a desired impedance value substantially equal to the output impedance of said probe, said connector including
a generally tubular portion comprising first conductor means for communicating an electrical reference level between said instrument and said probe,
second conductor means disposed within said tubular portion for communicating an electrical signal from said probe to said instrument,
said first and second conductor means comprising a substantially constant impedance transmission line for said signal,
a termination resistor of said desired value, and
switch means for selectively shunting said line with said resistor.

6. The probe of claim 5, wherein said termination resistor has a value of about 50 ohms.

7. In a signal acquisition probe having a coaxial output connector adapted to engage a mating input connector on an electrical instrument, said output connector including a generally tubular portion comprising first conductor means for communicating an electrical reference level between the probe and the instrument, and second conductor means coaxially disposed within said tubular portion for communicating an electrical signal from the probe to the instrument, said first and second conductor means comprising a transmission line for such a signal, the improvement wherein said output connector additionally includes means within said tubular portion for terminating the output of said probe with a desired impedance value, comprising
a termination resistor of said value, and
switch means for electrically connecting said resistor in shunt with said transmission line.

8. The probe of claim 7, wherein said resistor is an annular disc resistor coaxially mounted within said tubular portion.

9. The probe of claim 7, wherein said resistor is mounted for movement into and out of electrical contact with the conductors of said transmission line.

* * * * *